United States Patent
Yasutomi et al.

(10) Patent No.: US 9,363,914 B2
(45) Date of Patent: Jun. 7, 2016

(54) SEMICONDUCTOR DEVICE

(75) Inventors: Goro Yasutomi, Fukuoka (JP); Yukimasa Hayashida, Fukuoka (JP)

(73) Assignee: MITUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/396,155

(22) PCT Filed: Jul. 13, 2012

(86) PCT No.: PCT/JP2012/067893
§ 371 (c)(1),
(2), (4) Date: Oct. 22, 2014

(87) PCT Pub. No.: WO2014/010074
PCT Pub. Date: Jan. 16, 2014

(65) Prior Publication Data
US 2015/0116956 A1   Apr. 30, 2015

(51) Int. Cl.
*H05K 7/00* (2006.01)
*H05K 7/02* (2006.01)
*H01L 23/10* (2006.01)
*H05K 7/14* (2006.01)

(52) U.S. Cl.
CPC *H05K 7/02* (2013.01); *H01L 23/10* (2013.01); *H05K 7/14* (2013.01); *H01L 2924/0002* (2013.01)

(58) Field of Classification Search
USPC .............. 361/820, 807, 809, 810; 174/138 E, 174/138 G; 257/776–779
See application file for complete search history.

(56) References Cited

U.S. PATENT DOCUMENTS

| | | | |
|---|---|---|---|
| 6,654,254 B2 * | 11/2003 | Szu | H01L 23/4093 24/458 |
| 6,787,900 B2 | 9/2004 | Shinohara et al. | |
| 7,180,743 B2 * | 2/2007 | Chen | H01L 23/4093 165/185 |
| 7,674,985 B2 * | 3/2010 | Kaji | H05K 1/0203 174/252 |

(Continued)

FOREIGN PATENT DOCUMENTS

| | | |
|---|---|---|
| JP | S48-16346 U | 2/1973 |
| JP | S51-47856 U | 4/1976 |

(Continued)

OTHER PUBLICATIONS

The First Korean Office Action issued by the Korean Patent Office on Oct. 15, 2015, which corresponds to Korean Patent Application No. 10-2015-7000186 and is related to U.S. Appl. No. 14/396,155; with English language partial translation.

(Continued)

*Primary Examiner* — Hung S Bui
(74) *Attorney, Agent, or Firm* — Studebaker & Brackett PC

(57) ABSTRACT

It is an object of the present invention to provide an easily assemblable semiconductor device including a cover that covers a top of a case and is reliably fixed to the case defining an outline of the semiconductor device. A semiconductor device according to the present invention includes: a case defining an outline of the semiconductor device; a cover covering a top of the case; and a fastener mechanically fixing the cover to the case, a through-hole is formed in the cover, the case includes a projection inserted into the through-hole, and the fastener is attachable to the projection inserted into the through-hole of the cover from the outside of the cover and locks the projection upon the attachment to prevent the projection from falling off the through-hole.

4 Claims, 5 Drawing Sheets

(56) References Cited

U.S. PATENT DOCUMENTS

| | | | | |
|---|---|---|---|---|
| 7,869,217 | B2* | 1/2011 | Chen | H01L 23/4093 165/80.2 |
| 8,102,670 | B2* | 1/2012 | Sakamoto | H05K 1/144 361/792 |
| 8,345,446 | B2* | 1/2013 | Li | H04M 1/0249 361/801 |
| 8,526,192 | B2* | 9/2013 | Chen | G06F 1/184 174/138 E |
| 2010/0290864 | A1* | 11/2010 | Wang | F16B 5/0208 411/383 |

FOREIGN PATENT DOCUMENTS

| | | |
|---|---|---|
| JP | H04-5649 U | 1/1992 |
| JP | H04-36246 U | 3/1992 |
| JP | H07-86769 A | 3/1995 |
| JP | H09-23536 A | 1/1997 |
| JP | 2001-127238 A | 5/2001 |
| JP | 2004-260011 A | 9/2004 |
| JP | 2005-217125 A | 8/2005 |
| JP | 2006-017250 A | 1/2006 |
| JP | 2007-234649 A | 9/2007 |
| JP | 2011-249568 A | 12/2011 |

OTHER PUBLICATIONS

International Search Report; PCT/JP2012/067893; Oct. 16, 2012.
An Office Action; "Notification of Reason(s) for Refusal," issued by the Japanese Patent Office on Mar. 24, 2015, which corresponds to Japanese Patent Application No. 2014-524566 and is related to U.S. Appl. No. 14/396,155; with English language partial translation.
Notification Concerning Transmittal of International Preliminary Report on Patentability and Translation of Written Opinion of the International Searching Authority; PCT/JP2012/067893; issued on Jan. 22, 2015.
The Second Korean Office Action issued by the Korean Patent Office on Mar. 15, 2016, which corresponds to Korean Patent Application No. 10-2015-7000186 and is related to U.S. Appl. No. 14/396,155; with English language partial translation.

* cited by examiner

F I G. 2
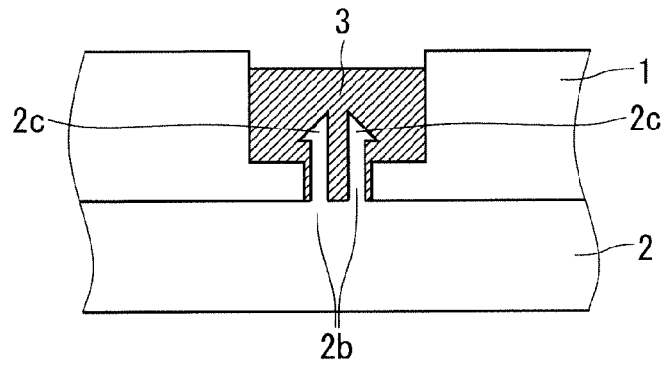
F I G. 3
(a)
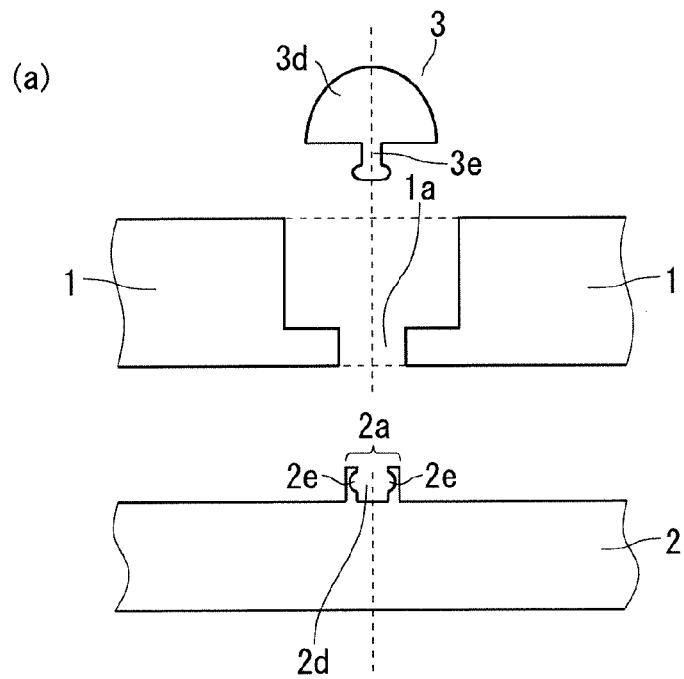
(b)
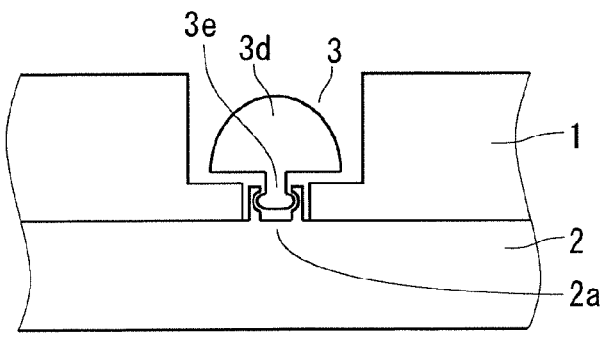

(a)

(b)

SEMICONDUCTOR DEVICE

TECHNICAL FIELD

The present invention relates to a semiconductor device.

BACKGROUND ART

Semiconductor devices such as semiconductor modules are generally housed in cases and used with covers provided on top of the cases.

In the conventional semiconductor device, the cover covering the top of the case has been fixed to the case defining an outline of the semiconductor device with an adhesive agent or screws (for example, see Patent Document 1).

In this specification, a case serving as a housing of a semiconductor device and also a cover are included to be referred to as the semiconductor device.

PRIOR ART DOCUMENT

Patent Document

Patent Document 1: Japanese Patent Application Laid-Open No. 2001-127238

SUMMARY OF INVENTION

Problems to be Solved by the Invention

In the conventional semiconductor device as described above, the cover is fixed to the case with the adhesive agent or screws. In a case of fixing with the adhesive agent, the heat generated upon the operation of the semiconductor device, for example, may degrade a bonded portion, and thus the cover may fall off. Moreover, in a case of fixing with the screws, workability deteriorates in assembly.

The present invention has been made in view of the above-mentioned problems, and an object thereof is to provide an easily assemblable semiconductor device including a cover that covers a top of a case and is reliably fixed to the case defining an outline of the semiconductor device.

Means for Solving the Problems

A semiconductor device according to the present invention includes: a case defining an outline of the semiconductor device; a cover covering a top of the case; and a fastener mechanically fixing the cover to the case, a through-hole is formed in the cover, the case includes a projection inserted into the through-hole, and the fastener is attachable to the projection inserted into the through-hole of the cover from the outside of the cover and locks the projection upon the attachment to prevent the projection from falling off the through-hole.

Another semiconductor device according to the present invention includes: a case defining an outline of the semiconductor device; a cover covering a top of the case; and a fastener mechanically fixing the cover to the case, a through-hole is formed in the cover, a hole is formed in the case below the through-hole, and the fastener is attachable to the hole of the case from the outside of the cover to prevent the case from falling off the fastener upon the attachment.

Effects of the Invention

In the semiconductor device according to the present invention, the fastener locks the projection of the case, thereby mechanically fixing the cover to the case, and thus the heat generated upon the operation of the semiconductor device does not degrade the fixed portion of the case and the cover unlike the case of fixing with the adhesive agent. Consequently, the long-life semiconductor device having high durability against high temperatures can be obtained. Furthermore, if the fastener is attachable to the projection of the case with a single motion, the assembly easier than the conventional technique can be achieved.

Also in the other semiconductor device according to the present invention, the fastener is attached to the hole of the case, thereby mechanically fixing the cover to the case, and thus the effects similar to those described above can be obtained.

These and other objects, features, aspects and advantages of the present invention will become more apparent from the following detailed description of the present invention when taken in conjunction with the accompanying drawings.

BRIEF DESCRIPTION OF DRAWINGS

FIG. 2 is a cross-sectional view illustrating a fixed portion of a case and a cover of a semiconductor device according to a second embodiment;

FIG. 3 is a cross-sectional view illustrating a fixed portion of a case and a cover of a semiconductor device according to a third embodiment;

DESCRIPTION OF EMBODIMENTS

First Embodiment

Configuration

A semiconductor device in this embodiment is assumed to be a semiconductor module housed in a case 2 with a cover 1 covering a top of the case 2. The semiconductor module and the configuration of housing in the case 2 of the semiconductor module are conventional and general.

Figure 1:
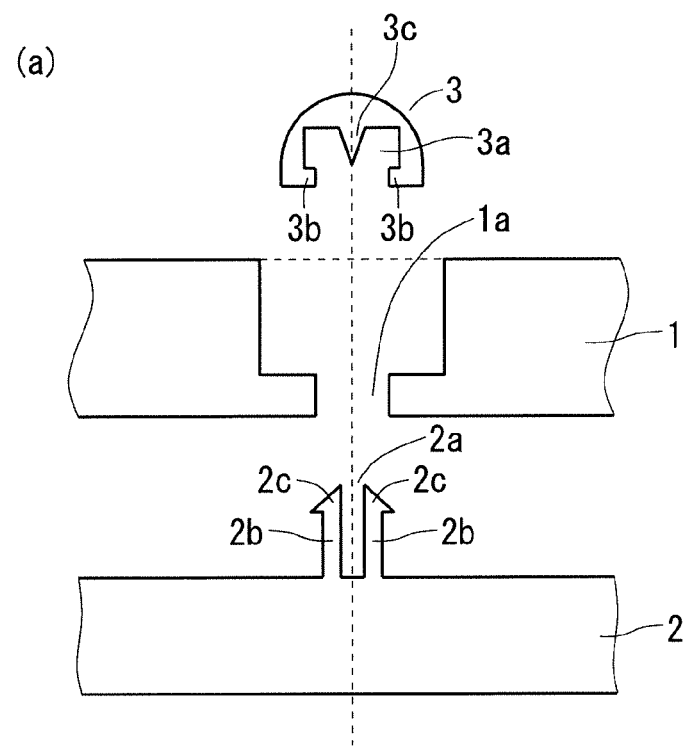
FIG. 1 is a cross-sectional view illustrating a fixed portion of a case and a cover of a semiconductor device according to a first embodiment.
Figure 1:
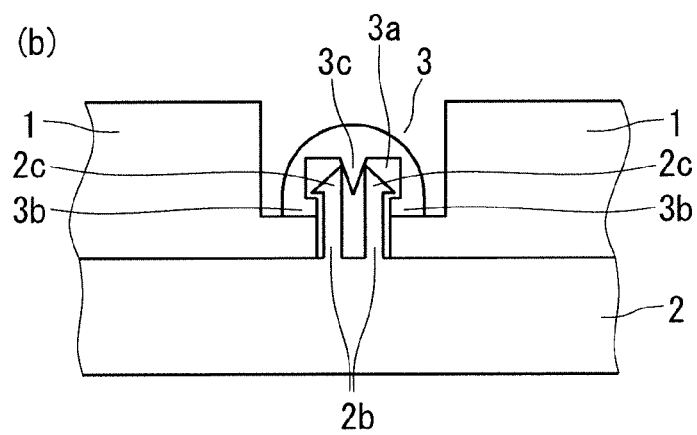

Part (b) of FIG. 1 is a cross-sectional view illustrating a fixed portion of the case 2 and the cover 1 of the semiconductor device according to this embodiment. The cover 1 covering the top of the case 2 is disposed on the top of the case 2 defining an outline of the semiconductor device, and the cover 1 and the case 2 are fixed with a fastener 3.

Part (a) of FIG. 1 is a cross-sectional view illustrating the case 2 defining the outline of the semiconductor device, the cover 1 covering the top of the case 2, and the fastener 3 fixing the cover 1 to the case 2. A through-hole 1a is formed in the cover 1. A projection 2a that can penetrate the through-hole 1a is formed on the case 2. The projection 2a includes a plurality, for example, two of upright projections 2b. Each upright projection 2b includes a hook 2c formed on its tip.

A recessed portion 3a is formed in the fastener 3, and a first locking projection 3b is formed on an inlet side of the recessed portion 3a. In addition, a second locking projection 3c is formed on an inner side of the recessed portion 3a. The size of the fastener 3 cannot penetrate the through-hole 1a formed in the cover 1.

The case 2 and the cover 1 are fixed as follows. First, the projection 2a of the case 2 is inserted into the through-hole 1a of the cover 1. Next, when the projection 2a is inserted into the recessed portion 3a of the fastener 3, the second locking projection 3c formed in the recessed portion 3a expands space between the upright projections 2b. The hook 2c formed on the tip of each of the upright projections 2b which have been expanded is locked by the first locking projection 3b formed on the inlet side of the recessed portion 3a. Thus, the fastener 3 locks the projection 2a of the case 2, thereby mechanically fixing the cover 1 to the case 2.

<Effects>

The semiconductor device of this embodiment includes: the case 2 defining the outline of the semiconductor device; the cover 1 covering the top of the case 2; and the fastener 3 mechanically fixing the cover 1 to the case 2, the through-hole 1a is formed in the cover 1, the case 2 includes the projection 2a inserted into the through-hole 1a, and the fastener 3 is attachable to the projection 2a inserted into the through-hole 1a of the cover 1 from the outside of the cover 1 and locks the projection 2a upon the attachment to prevent the projection 2a from falling off the through-hole 1a.

Therefore, in this embodiment, the cover 1 is mechanically fixed to the case 2 with the fastener 3, so that the heat generated upon the operation of the semiconductor device does not degrade the fixed portion of the case 2 and the cover 1 unlike the case of fixing with the adhesive agent. Consequently, the long-life semiconductor device having high durability against high temperatures can be obtained. Furthermore, if the fastener 3 is attachable with a single motion, this enables the assembly easier than the conventional technique.

In the semiconductor device of this embodiment, the projection 2a includes the plurality of upright projections 2b, the hook 2c is formed on the tip of each of the upright projections 2b, the fastener 3 has the recessed portion 3a into which the projection 2a is insertable, the first locking projection 3b is formed on the inlet side of the recessed portion 3a, and the second locking projection 3c is formed on the inner side of the recessed portion 3a. In the semiconductor device of this embodiment, when the plurality of upright projections 2b are inserted into the recessed portion 3a of the fastener 3, the second locking projection 3c expands the upright space between the upright projections 2b such that the hooks 2c are locked by the first locking projection 3b.

Therefore, in this embodiment, the second locking projection 3c expands the upright space between the upright projections 2b, so that the hooks 2c formed on the tips of the upright projections 2b are configured to be hardly unlocked from the first locking projection 3b. This enables to reliably fix the cover 1 to the case 2. Furthermore, unlike the conventional technique, the fastener 3 is attachable to the projection 2a with a single motion, which allows for the easier assembly.

Second Embodiment

FIG. 2 is a cross-sectional view illustrating a fixed portion of a case 2 and a cover 1 of a semiconductor device according to this embodiment. In the embodiment, the configurations of the case 2 and the cover 1 are the same as those in the first embodiment, so that description will be omitted. In the first embodiment, the projection 2a formed on the case 2 includes the plurality of upright projections 2b, but in this embodiment, the projection 2a may not include the plurality of upright projections 2b.

The case 2 and the cover 1 are fixed as follows. First, the projection 2a of the case 2 is inserted into a through-hole 1a of the cover 1. Next, a resin is injected into the through-hole 1a. The resin which has been injected is cured, and then the cured resin serves as a fastener 3 to lock hooks 2c formed on tips of the upright projections 2b. In other words, the fastener 3 locks the projection 2a of the case 2, thereby fixing the cover 1 to the case 2.

<Effects>

In the semiconductor device of this embodiment, the hooks 2c are formed on the tip of the projection 2a formed on the case 2, and the fastener 3 is the resin injected into the through-hole 1a and cured. In the semiconductor device of this embodiment, the fastener 3 formed of the cured resin locks the hooks 2c formed on the tip of the projection 2a.

Therefore, in this embodiment, the resin injected into the through-hole 1a and cured serves as the fastener 3 to lock the hooks 2c formed on the tip of the projection 2a, thereby mechanically fixing the cover 1 to the case 2. Thus, the heat generated upon the operation of the semiconductor device does not degrade the fixed portion of the case 2 and the cover 1. Consequently, the long-life semiconductor device having high durability against high temperatures can be obtained similarly to the first embodiment.

Third Embodiment

Part (b) of FIG. 3 is a cross-sectional view illustrating a fixed portion of a case 2 and a cover 1 of a semiconductor device according to this embodiment. Part (a) of FIG. 1 is a cross-sectional view illustrating the case 2 defining the outline of the semiconductor device, the cover 1 covering the top of the case 2, and a fastener 3 fixing the cover 1 to the case 2.

As with the first embodiment, a through-hole 1a is formed in the cover 1. A projection 2a insertable into the through-hole 1a is formed on the case 2, and a recessed portion 2d is formed in the tip of the projection 2a. Furthermore, a depression 2e is formed in an interior wall of the recessed portion 2d.

A head portion 3d of the fastener 3 is larger than the through-hole 1a formed in the cover 1. An arm portion 3e of the fastener 3 has a shape that fits in the recessed portion 2d of the tip of the projection 2a, and the tip of the arm portion 3e has a shape that fits in the depression 2e formed in the interior wall of the recessed portion 2d. In addition, the fastener 3 or the case 2 is formed of, for example, a resin, and has elasticity.

The case 2 and the cover 1 are fixed as follows. First, the projection 2a of the case 2 is inserted into the through-hole 1a. Next, when the arm portion 3e of the fastener 3 is inserted into the recessed portion 2d of the projection 2a of the case 2 which has been inserted, the tip of the arm portion 3e of the fastener 3 fits in the depression 2e of the recessed portion 2d by the elasticity of the fastener 3 or the case 2. Thus, the fastener 3 locks the projection 2a of the case 2, thereby fixing the cover 1 to the case 2.

<Effects>

In the semiconductor device of this embodiment, the recessed portion 2d is formed in the tip of the projection 2a of the case 2, the depression 2e is formed in the interior wall of the recessed portion 2d of the projection 2a, and the fastener 3 including the head portion 3d larger than the through-hole 1a of the cover 1 fits in the depression 2e such that the fastener 3 locks the projection 2a.

Therefore, in this embodiment, the fastener 3 locks the projection 2a of the case 2, thereby mechanically fixing the cover 1 to the case 2. Thus, the heat generated upon the operation of the semiconductor device does not degrade the fixed portion of the case 2 and the cover 1. Consequently, the long-life semiconductor device having high durability against high temperatures can be obtained similarly to the first embodiment. Furthermore, unlike the conventional technique, the fastener 3 is attachable to the projection 2a with a single motion, which allows for the easier assembly.

Fourth Embodiment

Figure 4:
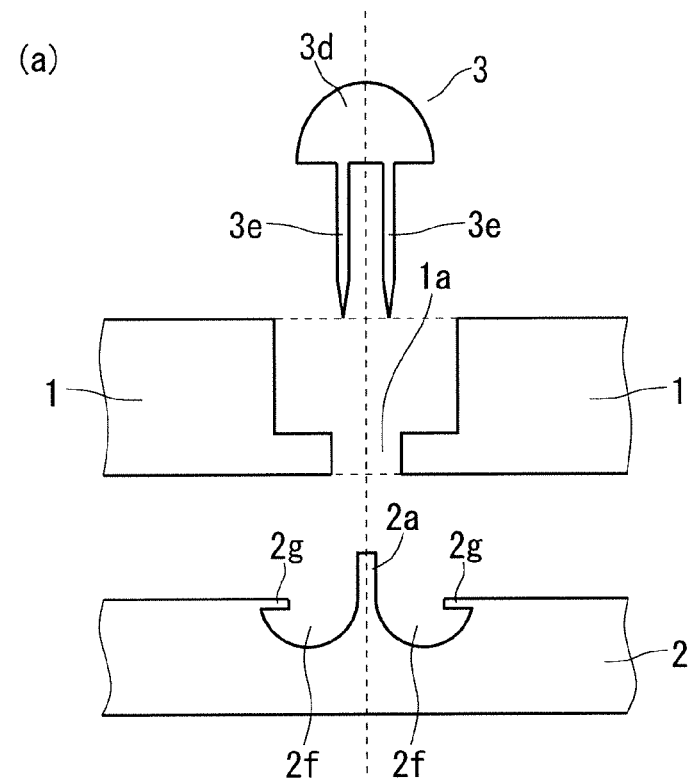
FIG. 4 is a cross-sectional view illustrating a fixed portion of a case and a cover of a semiconductor device according to a fourth embodiment.
Figure 4:
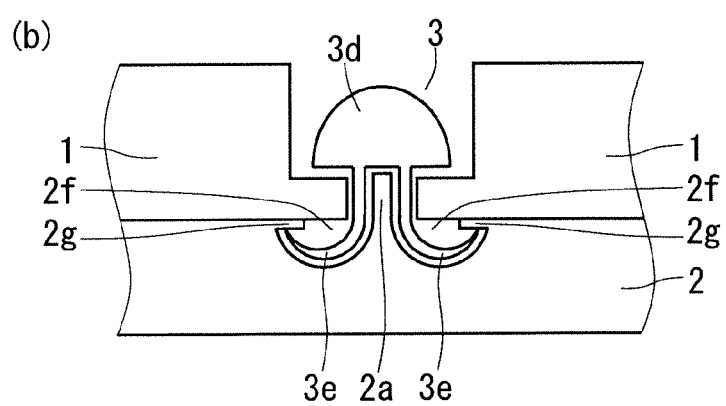

Part (b) of FIG. 4 is a cross-sectional view illustrating a fixed portion of a case 2 and a cover 1 of a semiconductor device according to this embodiment. Part (a) of FIG. 4 is a cross-sectional view illustrating the case 2 defining the outline of the semiconductor device, the cover 1 covering the top of the case 2, and a fastener 3 fixing the cover 1 to the case 2.

As with the first embodiment, a through-hole 1a is formed in the cover 1. A recessed portion 2f is formed in the case 2, and a projection 2a insertable into the through-hole 1a is formed on a bottom surface of the recessed portion 2f. Furthermore, a locking projection 2g is formed on an inlet side of the recessed portion 2f.

The fastener 3 includes a head portion 3d and arm portions 3e. The head portion 3d of the fastener 3 is larger than the through-hole 1a, and the two arm portions 3e extend from the head portion 3d. Note that the number of arm portions 3e is not limited to two.

The case 2 and the cover 1 are fixed as follows. First, the projection 2a of the case 2 is inserted into the through-hole 1a of the cover 1. Next, the arm portions 3e of the fastener 3 are inserted between the projection 2a and the through-hole 1a from the outside of the cover 1. At this time, each of the arm portions 3e is inserted while becoming deformed along the shape of the projection 2a and the recessed portion 2f. The locking projection 2g formed on the inlet side of the recessed portion 2f locks each of the arm portions 3e which has been inserted.

The locking portions 2g lock each of the arm portions 3e of the fastener 3, so that the fastener 3 locks the projection 2a of the case 2. Thus, the cover 1 is fixed to the case 2.

<Effects>

In the semiconductor device of this embodiment, the recessed portion 2f is formed in the case 2, the projection 2a is formed to protrude from the bottom surface of the recessed portion 2f, the locking projection 2g is formed on the inlet side of the recessed portion 2f, the fastener 3 includes the head portion 3d larger than the through-hole 1a and the arm portions 3e extending from the head portion 3d, and the arm portions 3e of the fastener 3 inserted between the projection 2a and the cover 1 become deformed along the projection 2a and the recessed portion 2f of the case 2 to be locked by the locking projection 2g.

Therefore, in this embodiment, the locking projection 2g locks the arm portions 3e of the fastener 3, thereby mechanically fixing the cover 1 to the case 2. Thus, the heat generated upon the operation of the semiconductor device does not degrade the fixed portion of the case 2 and the cover 1. Consequently, the long-life semiconductor device having high durability against high temperatures can be obtained similarly to the first embodiment. Furthermore, unlike the conventional technique, the fastener 3 is attachable to the projection 2a with a single motion, which allows for the easier assembly.

Fifth Embodiment

Figure 5:
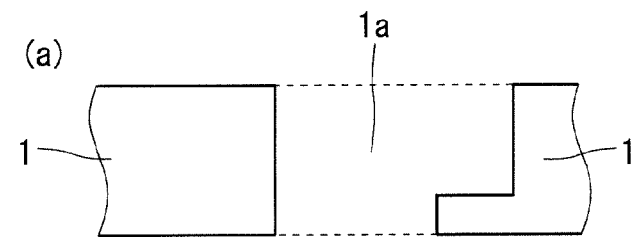
FIG. 5 is a cross-sectional view illustrating a fixed portion of a case and a cover of a semiconductor device according to a fifth embodiment.
Figure 5:
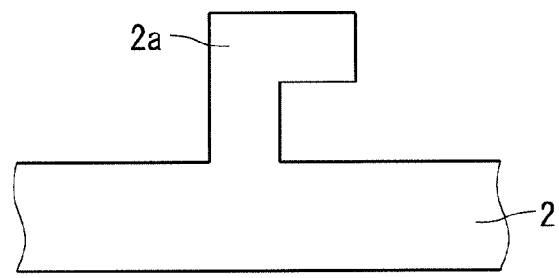
Figure 5:
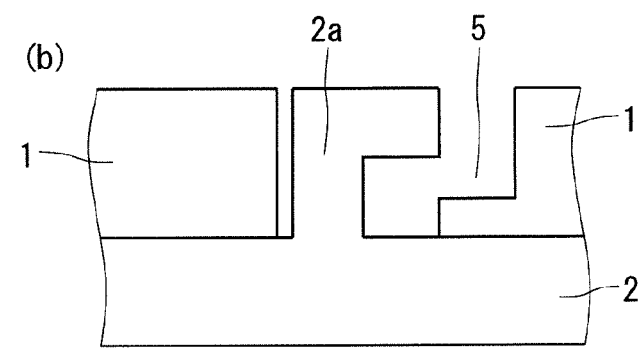
Figure 5:
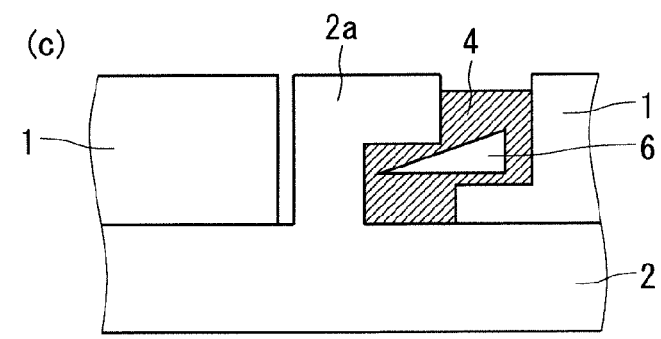

Part (c) of FIG. 5 is a cross-sectional view illustrating a fixed portion of a case 2 and a cover 1 of a semiconductor device according to this embodiment. Parts (a) and (b) of FIG. 5 are side views of the semiconductor device in the process of being assembled.

As shown in part (a) of FIG. 5, a through-hole 1a is formed in the cover 1. A projection 2a insertable into the through-hole 1a is formed on the case 2. As shown in part (b) of FIG. 5, when the projection 2a fits in the through-hole 1a, a recessed portion 5 is formed on a side surface of the fitting portion.

The case 2 and the cover 1 are fixed as follows. First, as shown in part (c) of FIG. 5, a first fastener 6 is inserted into the recessed portion 5 formed on the side surface of the fitting portion. Next, a resin is injected in the space between the recessed portion 5 and the first fastener 6. This resin is cured to be a second fastener 4. In this manner, the first fastener 6 and the second fastener 4 lock the projection 2a of the case 2, thereby fixing the cover 1 to the case 2.

<Effects>

In the semiconductor device of this embodiment, in a state where the projection 2a fits in the through-hole 1a, the recessed portion 5 is formed on the side surface of the fitting portion, the fastener includes the first fastener 6 and the second fastener 4, the first fastener 6 fits in the recessed portion 5, and the second fastener 4 is the resin injected into the fitting portion and cured in a state where the first fastener 6 fits in the recessed portion 5.

Therefore, in this embodiment, the first fastener 6 and the second fastener 4 lock the projection 2a of the case 2, thereby mechanically fixing the cover 1 to the case 2. Thus, the heat generated upon the operation of the semiconductor device does not degrade the fixed portion. Consequently, the long-life semiconductor device having high durability against high temperatures can be obtained similarly to the first embodiment.

Sixth Embodiment

Figure 6:
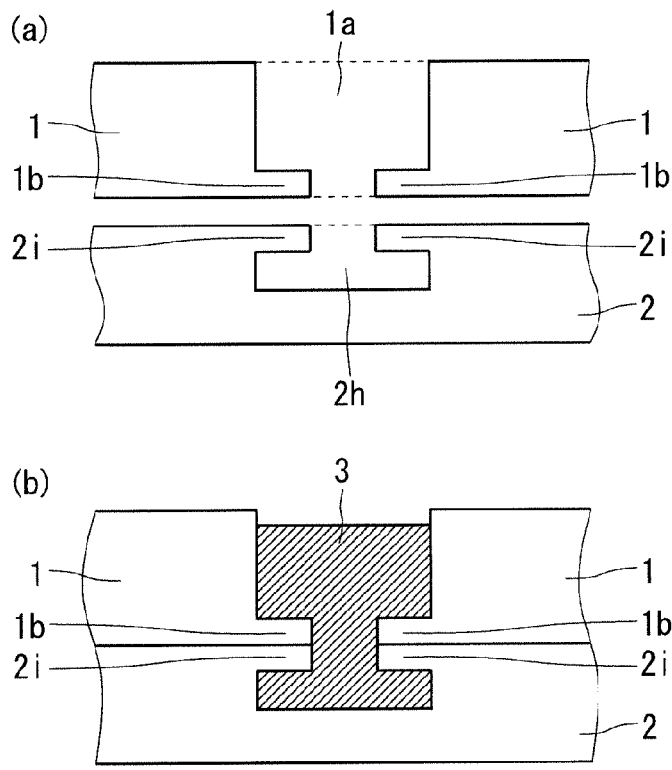
FIG. 6 is a cross-sectional view illustrating a fixed portion of a case and a cover of a semiconductor device according to a sixth embodiment.

Part (b) of FIG. 6 is a cross-sectional view illustrating a fixed portion of a semiconductor device according to this embodiment. In this embodiment, a cover 1 is mechanically fixed to a case 2 with a fastener 3. Part (a) of FIG. 6 is a cross-sectional view illustrating the case 2 defining the outline of the semiconductor device and the cover 1 covering the top of the case 2.

A through-hole 1a is formed in the cover 1. A first projection 1b is formed on an interior wall closer to an inner side of the through-hole 1a than an inlet side thereof. A hole 2h is formed in the case 2, and a second projection 2i is formed on an interior wall closer to an inlet side of the hole 2h than an inner side thereof.

The cover 1 is fixed to the case 2 as follows. First, the through-hole 1a of the cover 1 is disposed on a top of the hole 2h of the case 2. Next, a resin is injected into the hole 2h of the case 2 and the through-hole 1a of the cover 1. The resin which has been injected is cured to be a fastener 3.

The fastener 3, namely, the resin being injected and cured locks the first projection 1b and the second projection 2i, thereby mechanically fixing the cover 1 to the case 2.

<Effects>

The semiconductor device of this embodiment includes: the case 2 defining the outline of the semiconductor device; the cover 1 covering the top of the case 2; and the fastener 3 mechanically fixing the cover 1 to the case 2, the through-hole 1a is formed in the cover 1, the hole 2h is formed in the case 2 below the through-hole 1a, and the fastener 3 is attachable to the hole 2h of the case 2 from the outside of the cover 1 to prevent the case 2 from falling off the fastener 3 upon the attachment.

Therefore, the fastener 3 can mechanically fix the cover 1 to the case 2. Thus, the heat generated upon the operation of the semiconductor device does not degrade the fixed portion of the case 2 and the cover 1. Consequently, the long-life semiconductor device having high durability against high temperatures can be obtained similarly to the first embodiment.

In the semiconductor device of this embodiment, the through-hole 1a formed in the cover 1 is provided with the first projection 1b on the interior wall closer to the inner side than the inlet side, the hole 2h formed in the case 2 is provided with the second projection 2i on the interior wall closer to the inlet side than the inner side, the fastener 3 is the resin that is injected into the through-hole 1a and the hole 2h and is cured, and this cured resin locks the first projection 1b and the second projection 2i.

Therefore, the fastener 3, namely, the cured resin locks the first projection 1b and the second projection 2i, whereby the cover 1 can be mechanically fixed to the case 2.

Seventh Embodiment

Figure 7:
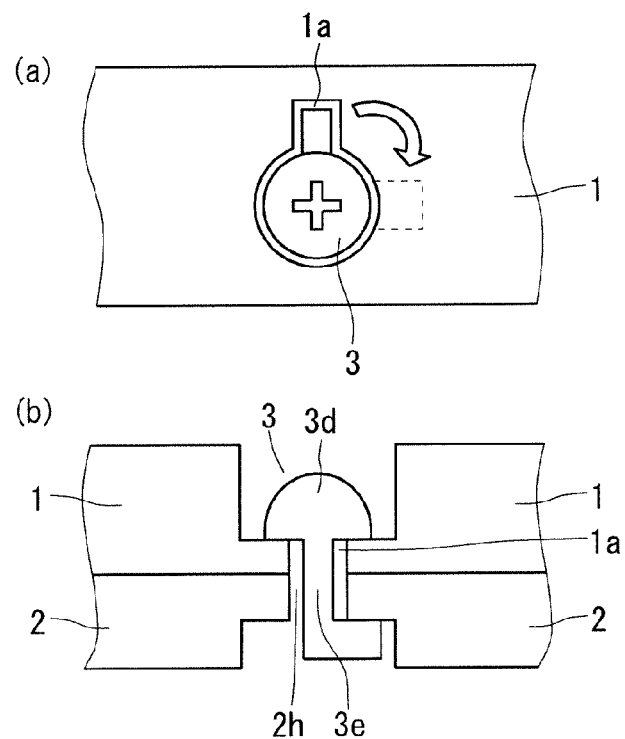
FIG. 7 is a cross-sectional view illustrating a fixed portion of a case and a cover of a semiconductor device according to a seventh embodiment.

Parts (a) and (b) of FIG. 7 are a plan view and a cross-sectional view, respectively, illustrating a fixed portion of a case 2 and a cover 1 of a semiconductor device according to this embodiment. A keyhole-shaped through-hole 1a is formed in the cover 1. A hole 2h penetrating the case 2 is formed in the case 2, and this hole 2h has the same keyhole shape as the shape of the through-hole 1a formed in the cover 1.

A fastener 3 is formed of a head portion 3d and an arm portion 3e. The head portion 3d of the fastener 3 is larger than the through-hole 1a formed in the cover 1. The arm portion 3e of the fastener 3 can penetrate the through-hole 1a of the cover 1 and the hole 2h of the case 2. Moreover, the tip of the arm portion 3e has a shape that fits in the keyhole shape of the through-hole 1a.

The cover 1 is fixed to the case 2 as follows. First, the cover 1 is disposed on the top of the case 2 such that the hole 2h of the case 2 overlaps the keyhole shape of the through-hole 1a of the cover 1. The arm portion 3e of the fastener 3 is inserted into through-hole 1a and the hole 2h of the case 2 from the outside of the cover 1. At this time, the tip of the arm portion 3e of the fastener 3 fits in the keyhole shape of the through-hole 1a and hole 2h.

Next, as shown in part (a) of FIG. 7, in a state where the tip of the arm portion 3e of the fastener 3 penetrates the hole 2h of the case 2, the fastener 3 is rotated by 90 degrees, for example. Rotating the fastener 3 results in the state of part (b) of FIG. 7 such that the tip of the arm portion 3e of the fastener 3 locks a surface of the case 2 opposite to the cover 1. Thus, the cover 1 is mechanically fixed to the case 2.

<Effects>

In the semiconductor device according to this embodiment, the through-hole 1a formed in the cover 1 has the keyhole shape, the hole 2h formed in the case 2 penetrates the case 2, the hole 2h has the same shape as the keyhole shape, the fastener 3 includes the head portion 3d that is not allowed to penetrate the through-hole 1a and the arm portion 3e that is allowed to penetrate the through-hole 1a and the hole 2h, the tip of the arm portion 3e of the fastener 3 has the shape that fits in the keyhole shape, and in a state where the tip of the arm portion 3e of the fastener 3 penetrates the through-hole 1a and the hole 2h, the fastener 3 is rotated such that the tip of the arm portion 3e of the fastener 3 locks the surface of the case 2 opposite to the cover 1.

Therefore, in this embodiment, the tip of the arm portion 3e of the fastener 3 locks the surface of the case 2 opposite to the cover 1, thereby mechanically fixing the cover 1 to the case 2. Thus, the heat generated upon the operation of the semiconductor device does not degrade the fixed portion of the case 2 and the cover 1. Consequently, the long-life semiconductor device having high durability against high temperatures can be obtained similarly to the first embodiment.

While the invention has been shown and described in detail, the foregoing description is in all aspects illustrative and not restrictive. It is therefore understood the numerous modifications and variations can be devised without departing from the scope of the invention.

DESCRIPTION OF NUMERALS 1 cover, 1a through-hole, 1b first projection, 2 case, 2a projection, 2b upright projection, 2c hook, 2d, 2f, 3a, 5 recessed portion, 2e depression, 2g locking projection, 2h hole, 2i second projection, 3 fastener, 3b first locking projection, 3c second locking projection, 3d head portion, 3e arm portion, 4 second fastener, 6 first fastener.

The invention claimed is:
1. A semiconductor device, comprising:
a case defining an outline of the semiconductor device;
a cover covering a top of said case; and
a fastener mechanically fixing said cover to said case, wherein
a through-hole is formed in said cover,
said case includes a projection inserted into said through-hole, and
said fastener is attachable to said projection inserted into said through-hole of said cover from the outside of said cover and locks said projection upon the attachment to prevent said projection from falling off said through-hole, and wherein
said projection includes a plurality of upright projections, a hook is formed on a tip of each of said upright projections, said fastener has a recessed portion into which said projection is insertable,
a first locking projection is formed on an inlet side of said recessed portion,
a second locking projection is formed on an inner side of said recessed portion, and
when said plurality of upright projections are inserted into said recessed portion of said fastener, said second locking projection expands an upright space between said upright projections so that said hooks are locked by said first locking projection.
2. A semiconductor device, comprising:
a case defining an outline of the semiconductor device;
a cover covering a top of said case; and
a fastener mechanically fixing said cover to said case, wherein
a through-hole is formed in said cover,
said case includes a projection inserted into said through-hole, and
said fastener is attachable to said projection inserted into said through-hole of said cover from the outside of said cover and locks said projection upon the attachment to prevent said projection from falling off said through-hole, and wherein
a recessed portion is formed in said case, said projection is formed to protrude from a bottom surface of said recessed portion, a locking projection is formed on an inlet side of said recessed portion, said fastener includes a head portion larger than said through-hole and an arm portion extending from said head portion, and said arm portion of said fastener inserted between said projection and said cover becomes deformed along said projection and said recessed portion of said case to be locked by said locking projection.

3. A semiconductor device, comprising:

a case defining an outline of the semiconductor device;

a cover covering a top of said case; and a fastener mechanically fixing said cover to said case, wherein a through-hole is formed in said cover, said case includes a projection inserted into said through-hole, and said fastener is attachable to said projection inserted into said through-hole of said cover from the outside of said cover and locks said projection upon the attachment to prevent said projection from falling off said through-hole, and wherein in a state where said projection fits in said through-hole, a recessed portion is formed on a side surface of a fitting portion, said fastener includes a first fastener and a second fastener, said first fastener fits in said recessed portion, and said second fastener is a resin injected into said fitting portion and cured in a state where said first fastener fits in said recessed portion.

4. A semiconductor device, comprising:

a case defining an outline of the semiconductor device;

a cover covering a top of said case; and a fastener mechanically fixing said cover to said case, wherein a through-hole provided with a first projection on an interior wall closer to an inner side than an inlet side is formed in said cover, a hole is formed in said case below said through-hole, said hole is provided with a second projection on an interior wall closer to an inlet side than an inner side, said fastener is attachable to said hole of said case from the outside of said cover to prevent said case from falling off said fastener upon the attachment, said fastener is a resin that is injected into said through-hole and said hole and is cured, and said cured resin locks said first and second projections.

* * * * *